United States Patent
Shimizu et al.

(10) Patent No.: US 9,082,756 B2
(45) Date of Patent: Jul. 14, 2015

(54) SEMICONDUCTOR DEVICE AND POWER SOURCE DEVICE

(71) Applicant: Fujitsu Limited, Kawasaki-shi, Kanagawa (JP)

(72) Inventors: Kozo Shimizu, Kawasaki (JP); Keishiro Okamoto, Kawasaki (JP); Nobuhiro Imaizumi, Kawasaki (JP); Tadahiro Imada, Kawasaki (JP); Keiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/225,923

(22) Filed: Mar. 26, 2014

(65) Prior Publication Data

US 2014/0203444 A1    Jul. 24, 2014

Related U.S. Application Data

(62) Division of application No. 13/355,792, filed on Jan. 23, 2012, now Pat. No. 8,728,867.

(30) Foreign Application Priority Data

Feb. 22, 2011  (JP) .................................. 2011-036254

(51) Int. Cl.
*H01L 23/48* (2006.01)
*H01L 23/00* (2006.01)
*H01L 23/31* (2006.01)

(52) U.S. Cl.
CPC ................ *H01L 23/48* (2013.01); *H01L 24/29* (2013.01); *H01L 24/32* (2013.01); *H01L 24/83* (2013.01);
(Continued)

(58) Field of Classification Search
CPC ............ H01L 2924/14; H01L 2924/00; H01L 2924/01029; H01L 2924/00012; H01L 2924/014

USPC ........... 257/773, 777, 781, 782, 783, E21.499
See application file for complete search history.

(56) References Cited

U.S. PATENT DOCUMENTS 5,622,590 A   4/1997   Kunitomo et al.
5,641,996 A   6/1997   Omoya et al.
(Continued)

FOREIGN PATENT DOCUMENTS

JP    58-207645    12/1983
JP    06-132442    5/1994
(Continued)

OTHER PUBLICATIONS

Japanese Office Action with Partial English translation for Japanese Patent Application No. 2011-036254 dated Oct. 28, 2014.
(Continued)

*Primary Examiner* — Andy Huynh
(74) *Attorney, Agent, or Firm* — Kratz, Quintos & Hanson, LLP

(57) ABSTRACT

A manufacturing of a semiconductor device includes forming one of a layer with a first metal and the layer with a second metal on one of a semiconductor chip mounting area of a support plate and a back surface of the semiconductor chip; forming the other of the layer with the first metal and the layer with the second metal on an area corresponding to a part of the area, in which one of the layer with the first metal and the layer with the second metal, of the other one of the semiconductor chip mounting area and the back surface of the semiconductor chip; and forming a layer which includes an alloy with the first metal and the second metal after positioning the semiconductor chip in the semiconductor chip mounting area to bond the semiconductor chip with the semiconductor chip mounting area.

8 Claims, 11 Drawing Sheets

(52) U.S. Cl.
CPC ... *H01L 23/3128* (2013.01); *H01L 2224/04026* (2013.01); *H01L 2224/05005* (2013.01); *H01L 2224/05082* (2013.01); *H01L 2224/05155* (2013.01); *H01L 2224/05166* (2013.01); *H01L 2224/05169* (2013.01); *H01L 2224/05541* (2013.01); *H01L 2224/05573* (2013.01); *H01L 2224/05644* (2013.01); *H01L 2224/26175* (2013.01); *H01L 2224/2745* (2013.01); *H01L 2224/2746* (2013.01); *H01L 2224/2912* (2013.01); *H01L 2224/2919* (2013.01); *H01L 2224/29019* (2013.01); *H01L 2224/2929* (2013.01); *H01L 2224/29036* (2013.01); *H01L 2224/29109* (2013.01); *H01L 2224/29111* (2013.01); *H01L 2224/29113* (2013.01); *H01L 2224/29139* (2013.01); *H01L 2224/29144* (2013.01); *H01L 2224/29147* (2013.01); *H01L 2224/29155* (2013.01); *H01L 2224/29339* (2013.01); *H01L 2224/29499* (2013.01); *H01L 2224/325* (2013.01); *H01L 2224/32225* (2013.01); *H01L 2224/32245* (2013.01); *H01L 2224/32502* (2013.01); *H01L 2224/32506* (2013.01); *H01L 2224/45124* (2013.01); *H01L 2224/45144* (2013.01); *H01L 2224/48091* (2013.01); *H01L 2224/48227* (2013.01); *H01L 2224/48245* (2013.01); *H01L 2224/48644* (2013.01); *H01L 2224/73265* (2013.01); *H01L 2224/83193* (2013.01); *H01L 2224/83194* (2013.01); *H01L 2224/83801* (2013.01); *H01L 2224/83851* (2013.01); *H01L 2924/00013* (2013.01); *H01L 2924/01029* (2013.01); *H01L 2924/01322* (2013.01); *H01L 2924/13064* (2013.01); *H01L 2924/15311* (2013.01)

(56) References Cited

U.S. PATENT DOCUMENTS

| | | | |
|---|---|---|---|
| 5,844,320 | A | 12/1998 | Ono et al. |
| 6,781,247 | B2 | 8/2004 | Shibata |
| 7,361,590 | B2 | 4/2008 | Kobayashi et al. |
| 7,973,412 | B2 | 7/2011 | Fujiwara et al. |
| 2004/0256730 | A1* | 12/2004 | Hirano et al. ............... 257/765 |
| 2006/0049521 | A1* | 3/2006 | Kayukawa et al. ........... 257/737 |
| 2006/0192291 | A1 | 8/2006 | Yokozuka |

FOREIGN PATENT DOCUMENTS

| | | |
|---|---|---|
| JP | 2006-156437 | 6/2006 |
| JP | 2006237419 A | 9/2006 |
| JP | 2007150119 A | 6/2007 |

OTHER PUBLICATIONS

Taiwanese Office Action dated Oct. 28, 2014 with English translation.

* cited by examiner

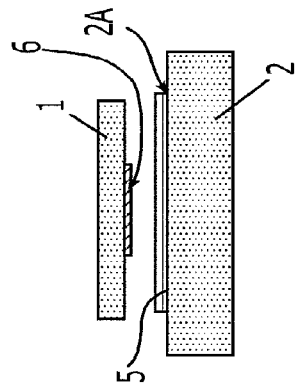
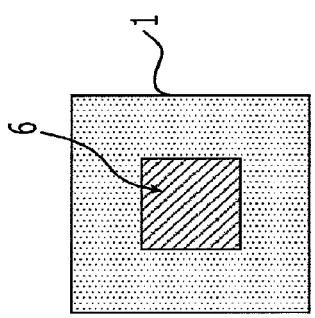
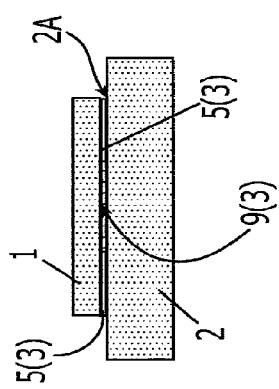
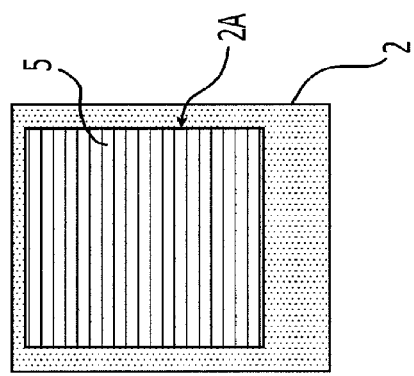

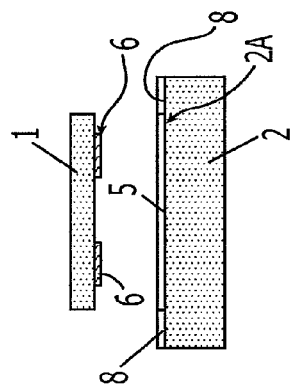
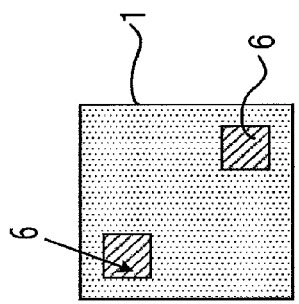
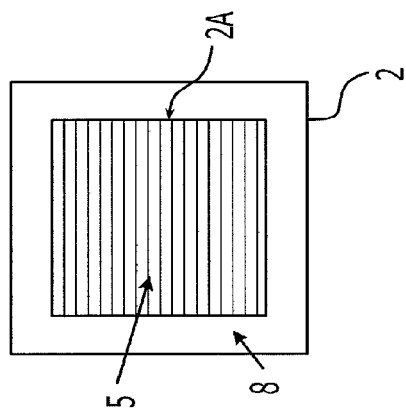
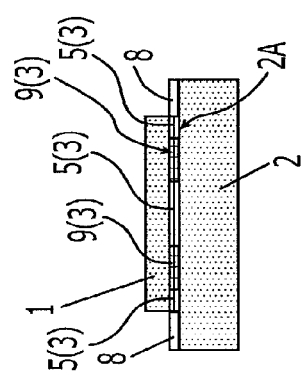
FIG. 6A
FIG. 6B
FIG. 6C
FIG. 6D

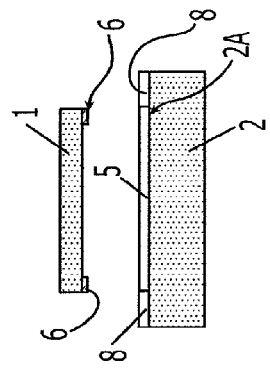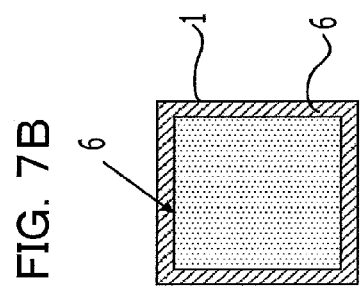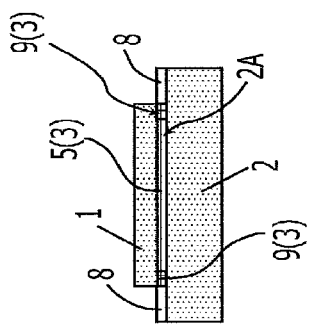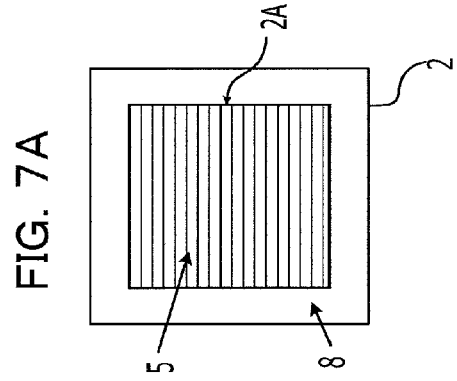

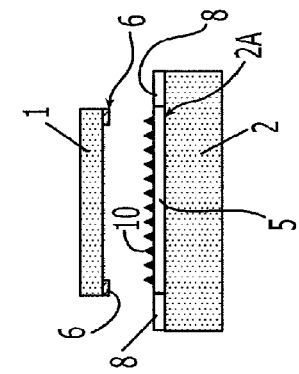
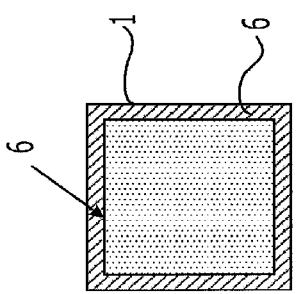
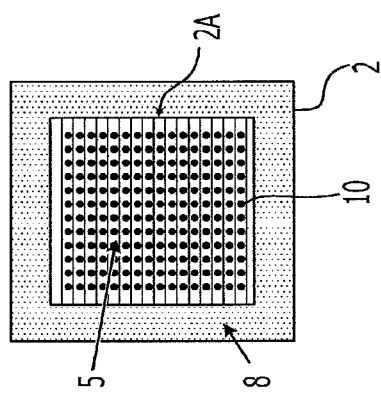
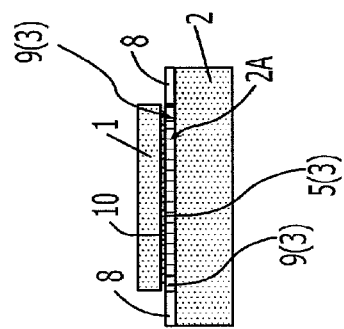

SEMICONDUCTOR DEVICE AND POWER SOURCE DEVICE

CROSS-REFERENCE TO RELATED APPLICATIONS

This application is a Divisional application Ser. No. 13/355,792 filed on Jan. 23, 2012, which is based upon and claims the benefit of priority from the prior Japanese Patent Application No. 2011-36254, filed on Feb. 22, 2011, the entire contents of both of which are incorporated herein by reference.

FIELD

The embodiments discussed herein are related to a semiconductor device, a manufacturing method of the semiconductor device, and a power source device.

BACKGROUND

There is a conventional high electron mobility transistor (HEMT) with a semiconductor laminate structure that includes a carrier running layer and a carrier supply layer. In recent years, a GaN-HEMT has been actively developed. By using heterojunction of AlGaN/GaN as a GaN-based compound semiconductor, the HEMT structure of the GaN-HEMT is formed where GaN as an electron running layer and AlGaN as an electron supply layer are layered.

The GaN is a material having a high breakdown field strength of which the bandgap is approximately 3.4 eV which is larger than the bandgap (approximately 1.1 eV) of Si and the bandgap (approximately 1.4 eV) of GaAs. The GaN is a material that has a high saturated electron velocity. Therefore, the GaN is expected to be used to achieve a semiconductor device for a power source that may operate with a high voltage and may obtain a high output. The GaN-HEMT is expected to work as a switching element with a high effect used for a power source device provided in an electron device.

The semiconductor chip with the above-described GaN-HEMT is mounted on a support plate of a circuit substrate, a stage of the lead frame, or the like. There is a technique for mounting the semiconductor chip on the support plate by bonding the back surface of the semiconductor chip with the semiconductor chip mounting area of the support plate by using a die bounding agent, such as a solder and an adhesive agent. For example, Japanese Laid-open Patent Publication No. 2006-156437, Japanese Laid-open Patent Publication No. 6-132442, and Japanese Laid-open Patent Publication No. 58-207645 are disclosed as the related art.

SUMMARY

According to an aspect of the invention, a manufacturing of a semiconductor device includes forming one of a layer with a first metal and the layer with a second metal on one of a semiconductor chip mounting area of a support plate and a back surface of the semiconductor chip; forming the other of the layer with the first metal and the layer with the second metal on an area corresponding to a part of the area, in which one of the layer with the first metal and the layer with the second metal, of the other one of the semiconductor chip mounting area and the back surface of the semiconductor chip; and forming a layer which includes an alloy with the first metal and the second metal after positioning the semiconductor chip in the semiconductor chip mounting area to bond the semiconductor chip with the semiconductor chip mounting area.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1A and FIG. 1B are plain views illustrating an example of a manufacturing method of a semiconductor device and a semiconductor device according to a first embodiment;

FIG. 1C and FIG. 1D are cross-sectional diagrams illustrating an example of the manufacturing method of the semiconductor device and the semiconductor device according to the first embodiment;

FIG. 5A is a plain view, and FIGS. 5B and 5C are cross-sectional diagrams;

FIGS. 6A to 6D are diagrams illustrating a manufacturing method of the semiconductor device and another deformation example of the semiconductor device, FIGS. 6A and 6B are plain views, and FIGS. 6C and 6D are cross-sectional diagrams;

FIGS. 7A to 7D are diagrams illustrating a manufacturing method of the semiconductor device and another deformation example of the semiconductor device, FIGS. 7A and 7B are plain views, and FIGS. 7C and 7D are cross-sectional diagrams;

FIGS. 8A to 8D are diagrams illustrating a manufacturing method of the semiconductor device and another deformation example of the semiconductor device, FIGS. 8A and 8B are plain views, and FIGS. 8C and 8D are cross-sectional diagrams;

DESCRIPTION OF EMBODIMENTS

With reference to the attached diagrams, a semiconductor device, a manufacturing method of the semiconductor device, and a power source device according to the embodiments will be described below. With reference to FIGS. 1 to 4, the semiconductor device and the manufacturing method of the semiconductor device according to a first embodiment will be described.

The semiconductor device according to the first embodiment, which is a compound semiconductor device that uses, for example, a nitride-based compound semiconductor (for example, a GaN-based compound semiconductor), is a semiconductor package that encapsulates a semiconductor chip, which has a nitride-based semiconductor laminate structure with a carrier running layer and a carrier supply layer, with a resin. A semiconductor chip is also called a semiconductor element or a power semiconductor element that is operated by a high current. A discrete package is given as an example in the following description.

Figure 2:
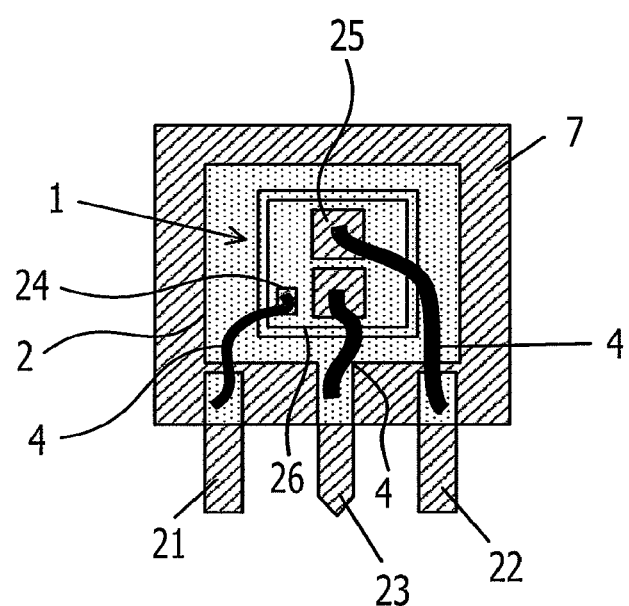
FIG. 2 is a plain view illustrating an example of the semiconductor device according to the first embodiment.
Figure 3:
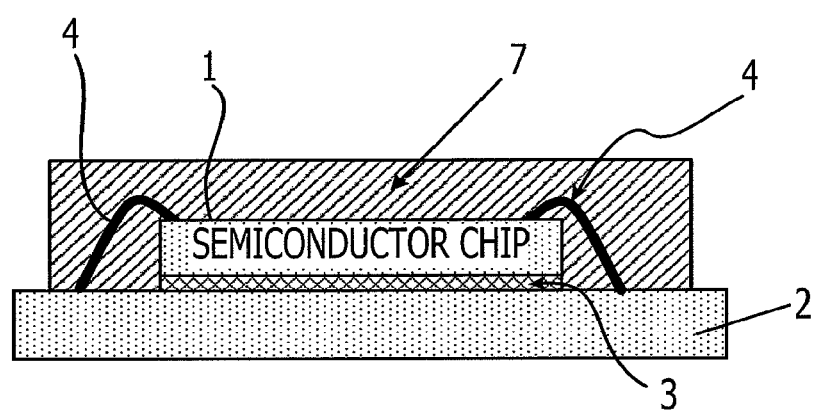
FIG. 3 is a cross-sectional diagram illustrating another example of the semiconductor device according to the first embodiment.

As illustrated in FIGS. 2 and 3, the semiconductor device includes a semiconductor chip 1, a stage 2 on which the semiconductor chip 1 is mounted, a bonding layer 3, a gate lead 21, a source lead 22, a drain lead 23, a bonding wire (an Al wire in this case) 4, and a molding compound 7. The molding compound 7 is also called molded resin. The stage 2 is a stage of a lead frame, for example. The stage 2 is also called support plate.

A gate pad 24, a source pad 25, and a drain pad 26 of the semiconductor chip 1 mounted on the stage 2 are coupled with the gate lead 21, the source lead 22, and the drain lead 23 with the Al wire 4, respectively, and are encapsulated with the molding compound 7. In this case, the stage 2 that is fixed with the back surface (the back surface of the substrate) of the semiconductor chip 1 is electrically coupled with the drain lead 23. The first embodiment is not limited to this case. The stage 2 may be electrically coupled with the source lead 22.

In this case, the semiconductor chip 1 includes a GaN-HEMT with a GaN-based semiconductor laminate structure that includes a GaN electron running layer and an AlGaN electron supply layer. The semiconductor chip is, for example, a GaN-HEMT chip for the power source used as a switching element provided in an electronic device or a power source device. A GaN-based HEMT chip 1 includes a gate electrode, a source electrode, and a drain electrode in the upper part of the GaN-based semiconductor laminate structure. The GaN-based HEMT chip 1 includes a wiring layer that includes an insulting film and a wiring in the upper part of the above-described electrodes. The gate pad 24, the source pad 25, and the drain pad 26 are exposed on the surface of the GaN-based HEMT chip 1. The GaN-HEMT is also called GaN-based HEMT. The GaN-HEMT chip is also called GaN-based HEMT chip.

The manufacturing method of the semiconductor device (discrete package) according to the first embodiment will be described below. The manufacturing method of the semiconductor device is also called mounting method of the semiconductor chip. The semiconductor chip 1, which includes the nitride semiconductor laminate structure with the carrier running layer and the carrier supply layer, is fixed on the stage 2 of the lead frame. For example, by bonding with the bonding wire 4 such as an Al wire, the gate pad 24 of the semiconductor chip 1 is coupled with the gate lead 21, the drain pad 26 is coupled with the drain lead 23, and the source pad 25 is coupled with the source lead 22.

Figure 11:
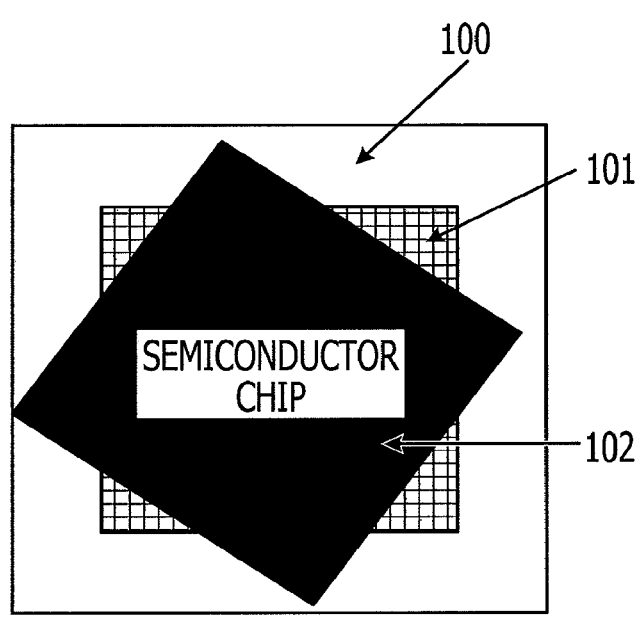
FIG. 11 is a plain view illustrating the problem of the present invention.

The semiconductor chip 1 is encapsulated with a resin by a transfer molding method, for example. That is, the molding compound 7 used to encapsulate the semiconductor chip 1 is formed. The semiconductor chip 1 is removed from the lead frame, and the semiconductor device (discrete package) is obtained. As illustrated in FIG. 11, for example, if a die attach agent such as an adhesive agent that includes a solder or a thermal conductive resin to fix the semiconductor chip 1 on the stage 2 of the lead frame, position shift such as movement or rotation of the semiconductor chip 1 may be generated.

According to the first embodiment, the semiconductor chip 1 is fixed on the stage 2 of the lead frame in the following manner. As illustrated in FIG. 1A, on the whole surface of a semiconductor chip mounting area 2A on the stage 2 of the lead frame, an Ag layer 5 is formed as a layer with a first metal by an electrolytic plating method, for example. The thickness of the Ag layer 5 is approximately 5 μm, for example. The area in which the Ag layer 5 is formed may be specified by resist patterning, for example. The size (area) of the semiconductor chip mounting area 2A is almost equal to the size (area) of the back surface of the semiconductor chip 1. The semiconductor chip mounting area 2A is also called lead frame mounting area. In this case, for example, a material obtained by adding a slight amount of Zr (zirconium) to Cu may be used as a lead frame.

Figure 5A:
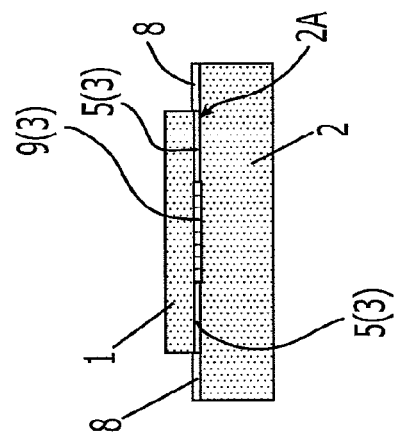
FIGS. 5A to 5C are diagrams illustrating a deformation example of the manufacturing method of the semiconductor device and the semiconductor device according to the first embodiment.

In this stage, as illustrated in FIG. 5A, in the area around the semiconductor chip mounting area 2A on the stage 2 of the lead frame, a Cr layer 8 that is incompatible with Sn may be formed as a layer with a third metal, which is non-reactive with at least one of the first metal and the second metal, by an electrolytic plating method, for example. The thickness of the Cr layer 8 may be approximately 2 μm, for example. In this case, the area in which the Cr layer 8 is formed may be specified by the resist patterning, for example. This prevents a Sn layer 6 from oozing out in melting operation described below.

As illustrated in FIG. 1B, in a part of the back surface of the semiconductor chip 1, the Sn layer 6 as a layer that includes the second metal is formed by the electrolytic plating method, for example. The thickness of the Sn layer 6 is approximately 2.6 μm, for example. In this case, the Sn layer 6 is formed in the central part of the back surface of the semiconductor chip 1. In this manner, by forming the Sn layer 6 in the central part of the back surface of the semiconductor chip 1, the Sn layer 6 is prevented from oozing out in the area around the semiconductor chip mounting area 2A in the heat bonding described below. The area in which the Sn layer 6 is formed may be specified by the resist patterning, for example. The Sn layer 6 is formed in a part of the back surface of the semiconductor chip 1. As described below, by alloying with the Ag layer 5, the Sn layer 6 has a function for positioning the semiconductor chip 1 in the semiconductor chip mounting area 2A. As a result, the Sn layer is also called positioning metal layer or positioning bump.

In this case, it is preferable that metalizing processing of Ti/Ni/Au is performed on the back surface of the semiconductor chip 1, for example, on the back surface of the SiC substrate that supports the GaN-based semiconductor laminate structure. That is, it is preferable that the Sn layer 6 is formed on the adhesion layer after the adhesion layer in which Ti, Ni, and Au are layered in order is formed by a sputtering method, a plating method (for example, an electrolytic plating method, and an electroless plating method), or the like. For example, the thickness of the Ti layer, the Ni layer, and the Au layer forming the adhesion layer is approximately 100 nm, 200 nm, and 100 nm, respectively. The area in which the adhesion layer is formed may be specified by the resist patterning, for example. In addition to the adhesion layer in which Ti, Ni, and Au are layered in order, the adhesion layer in which Ti, Pt, and Au are layered in order may be used as the adhesion layer used to adhere the Sn layer 6 to the back surface of the semiconductor chip 1. That is, the metalizing processing of Ti/Pt/Au may be performed on the back surface of the semiconductor chip 1, for example, on the back surface of the SIC substrate that supports the GaN-based semiconductor laminate structure.

As illustrated in FIG. 1C, the semiconductor chip 1 is positioned on the semiconductor chip mounting area 2A on the stage 2. As illustrated in FIG. 1D, a Sn—Ag alloy layer 9 is formed as a layer that includes an alloy with Ag and Sn, and the semiconductor chip 1 is bonded with the semiconductor chip mounting area 2A on the stage 2. That is, the semiconductor chip 1 is positioned in the semiconductor chip mounting area 2A on the stage 2, and the semiconductor chip 1 is face-up mounted in the semiconductor chip mounting area 2A so that the Ag layer 5 formed on the whole surface of the semiconductor chip mounting area 2A is in contact with the Sn layer 6 formed in a part of the back surface of the semiconductor chip 1. By the heat bonding with the temperature from approximately 221 degrees C. or higher to approximately 240 degrees C. at the highest, the Sn—Ag alloy layer 9 is formed, and the semiconductor chip 1 is bonded with the semiconductor chip mounting area 2A on the stage 2 by the Sn—Ag alloy layer 9. As a result, the semiconductor chip 1 is fixed on the stage 2 of the lead frame. That is, the semiconductor chip 1 is surely boded with the semiconductor chip mounting area 2A on the stage 2 of the lead frame by metal-bonding with the Sn—Ag alloy layer 9. In this case, the Sn—Ag alloy as a bonding material used to bond the semiconductor chip 1 with the stage 2 of the lead frame may obtain a high heat radiation effect because the Sn—Ag alloy has a low thermal resistance.

Figure 5B:
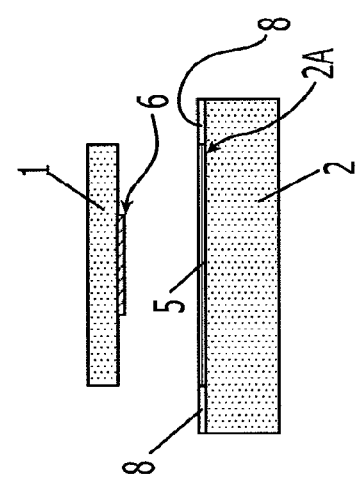
Figure 5C:
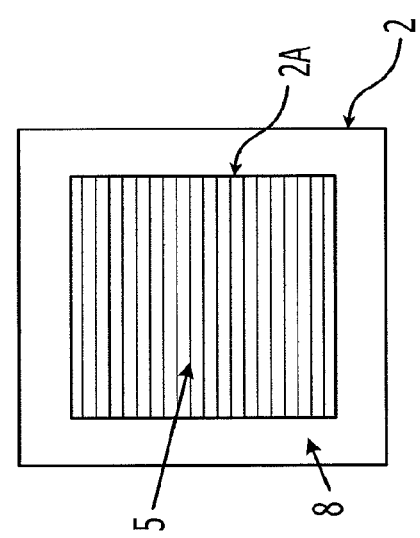

As illustrated in FIG. 5A, if the Cr layer 8 is formed in the area around the semiconductor chip mounting area 2A on the stage 2 of the lead frame, the semiconductor chip 1 is positioned on the semiconductor chip mounting area 2A on the stage 2 as illustrated in FIG. 5B. As illustrated in FIG. 5C, the Sn—Ag alloy layer 9 is formed, and the semiconductor chip 1 is bonded with the semiconductor chip mounting area 2A on the stage 2.

As described above, if the temperature is approximately 221 degrees or higher while the Ag layer 5 is in contact with the Sn layer 6, Ag has a eutectic reaction with Sn. Thus, the part in which the Ag layer 5 is in contact with the Sn layer 6 is melted and alloyed, so that the Sn—Ag alloy layer 9 is formed. The temperature of approximately 221 degrees C., which is the melting point of the Sn—Ag alloy, is the solidus temperature in the binary phase diagram of Sn and Ag. In this case, since the Sn layer 6 is provided simply in a part (the central part in this case) of the back surface of the semiconductor chip 1. Thus, the Ag layer 5 and the Sn layer 6 in the part are melted and alloyed, so that the Sn—Ag alloy layer 9 is formed. In this case, Ag has the eutectic reaction with Sn. According to the binary phase diagram of Sn and Ag, a liquid phase is generated at the solidus temperature 221 degrees C., and a solid phase of $Ag_3Sn$ and Sn is generated at the temperature equal to or lower than 221 degrees C. According to the binary phase diagram of Sn and Ag, the solubility limit of $Ag_3Sn$ indicates approximately 73.2 wt % of Ag and approximately 26.8 wt % of Sn. Accordingly, if diffusion melting of Ag into Sn proceeds up to approximately 73.2 wt % of Ag or higher, $Ag_3Sn$ is in the solid phase. Thus, the diffusion melting of Ag into Sn does not proceed any further. That is, the Ag layer 5 and the Sn layer 6 are not melted or spread out. As a result, if the ratio of thickness of the Ag layer and the Sn layer is 73.2:26.8, the Ag layer 5 and the layer 6 are melted and alloyed in the area in which the Sn layer 6 is formed, that is, in a part (the central part in this case) of the back surface of the semiconductor chip 1, so that the Sn—Ag alloy layer 9 is formed. Furthermore, even though the ratio of thickness of the Ag layer 5 and the Sn layer 6 is not 73.2:26.8, if the thickness of the Ag layer 5 is increased, the Ag layer 5 and the Sn layer 6 are melted and alloyed in an area that is smaller than the area in which the Sn layer 6 is formed, that is, in the part (the central part in this case) of the back surface of the semiconductor chip 1, so that the Sn—Ag alloy layer 9 is formed. Therefore, the Ag layer 5 formed in the area other than the area opposite to the area in which the Sn layer 6 is formed is melted, so that the Sn—Ag alloy layer 9 is not oozed out. That is, the Sn layer 6 formed in the part (the central part in this case) of the back surface of the semiconductor chip 1 and the Ag layer 5 formed in the area opposite to the part are melted. The Ag layer 5 formed in the area (the area outside of the central part in this case) other than the above-described areas is not melted and remains solid.

The structure of the semiconductor device, that is, the mounting structure of the semiconductor chip formed in the above-described manner will be described below. That is, as illustrated in FIG. 1D, the semiconductor device according to the first embodiment includes, the stage 2, the semiconductor chip 1 provided on the stage 2, and the bonding layer 3 that includes the Ag layer 5 and the Sn—Ag alloy layer 9 provided between the stage 2 and the semiconductor chip 1. In this case, while the Ag layer 5 is bonded with the stage 2, the Ag layer 5 is simply in contact with the semiconductor chip 1. The Sn—Ag alloy layer 9 is used to bond the stage 2 with the semiconductor chip 1. The Sn—Ag alloy layer 9 is provided in the central part of the semiconductor chip mounting area 2A on the stage 2, and the Ag layer 5 is provided outside the central part of the semiconductor chip mounting area 2A on the stage 2.

As illustrated in FIG. 5A, if the Cr layer 8 is formed in the area around the semiconductor chip mounting area 2A on the stage 2 of the lead frame, the area around the semiconductor chip mounting area 2A has the Cr layer 8 that is non-reactive with Sn included in the Sn—Ag alloy layer 9 as illustrated in FIG. 5C. An adhesion layer may be provided between the semiconductor chip 1 and the Sn—Ag alloy layer 9.

According to the semiconductor device and the manufacturing method of the semiconductor device of the first embodiment, there is an advantage that the position shift such as movement or rotation of the semiconductor chip 1 is not generated when the semiconductor chip 1 is mounted on the stage 2 of the lead frame. That is, when the semiconductor chip 1 is mounted on the stage 2 of the lead frame, the semiconductor chip 1 may be fixed (mounted) on a prescribed position on the stage 2 of the lead frame with a high accuracy without a bonding defect such as a position shift. The melting point of the Sn—Ag alloy included in the bonding layer 3 which is used to bond the stage 2 of the lead frame with the semiconductor chip 1 is approximately 221 degrees C., which is higher than the temperature in the operation of the semiconductor chip 1. This prevents the position shift of the semiconductor chip 1 due to heat generation in the operation. Furthermore, according to the first embodiment, since the Sn—Ag alloy layer 9 is formed in the central part of the semiconductor chip mounting area 2A, the Sn—Ag alloy layer 9 is prevented from oozing in the area around the semiconductor chip mounting area 2A on the stage 2 of the lead frame. In particularly, if the Cr layer 8 is formed in the area around the semiconductor chip mounting area 2A on the stage 2 of the lead frame, the Sn—Ag alloy layer 9 is surely prevented from oozing out. This prevents a bonding surface (a wire bonding electrode) formed by wire bonding from being contaminated, for example. As a result, a semiconductor device with a high reliability is manufactured, and the manufacturing yield is greatly improved.

Figure 4:
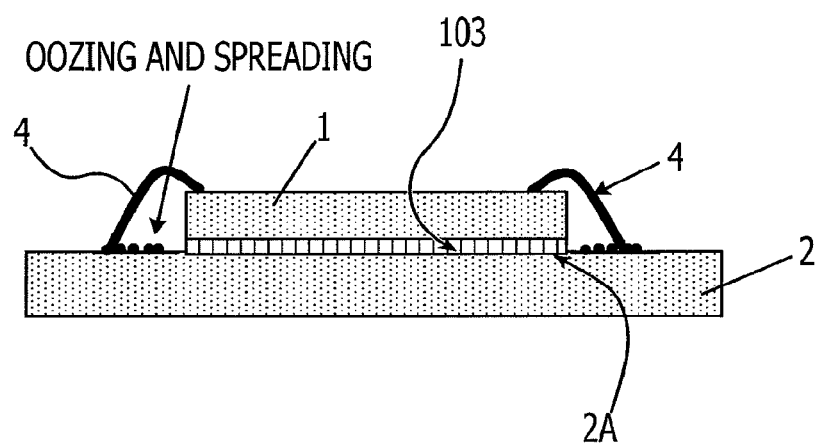
FIG. 4 is a cross-sectional diagram illustrating a problem of a conventional case of using a die bonding agent.

As illustrated in FIG. 4, it is difficult to manufacture the semiconductor device with the high reliability if the semiconductor chip 1 is bonded with the semiconductor chip mounting area 2A on the stage 2 where the solder, the Ag paste, or a die bonding agent 103 such as a thermal conductive agent is applied on the whole surface of one of the back surface of the semiconductor chip 1 and the semiconductor chip mounting area 2A. That is, it is difficult to manufacture the semiconductor device with the high reliability because the position shift such as movement or rotation of the semiconductor chip 1 is generated or the bonding surface of the bonding wire 4 formed by the wire bonding is contaminated by solder oozing or diffusion when the resin is hardened.

A thermal resistance in the operation of the semiconductor chip of the semiconductor device formed in the above-described manner is equal to or lower than approximately 0.3 degrees C/W. The thermal resistance is almost equal to the thermal resistant of the semiconductor device formed by solder bonding. Even if the semiconductor chip 1 is bonded with the stage 2 of the lead frame in the above-described manner, the heat of the semiconductor chip 1 may be efficiently radiated to the outside through the Ag layer 5 or the Sn—Ag alloy layer 9 and the stage 2 of the lead frame. For example, in the semiconductor device for the power source included in an electronic device with a high voltage and a high power, the amount of heat generated by the semiconductor chip 1 is increased, so that reliability of a control circuit may be affected. However, since the heat of the semiconductor chip 1 is efficiently radiated to the outside in the above-described manner, the semiconductor device with the high reliability may be achieved.

According to the above-described first embodiment, the Ag layer 5 is formed as a layer with the first metal, the Sn layer 6 is formed as a layer with the second metal, and the Sn—Ag alloy layer 9 is formed as a layer with the alloy obtained by alloying the first metal and the second metal. However, the layer with the first metal, the layer with the second metal, and the layer that includes the alloy with the first metal and the second metal are not limited to the above-described layers. That is, the layer 5 with the first metal may include one of Ag, Cu, Au, Bi, In, Ni, Pb, and Sb as the first metal. The layer 5 with the first metal may be a first metal layer with the first metal. The layer 5 with the first metal may be a layer with the first metal and another metal. The layer 5 with the first metal may be a layer with the first metal and a resin. In this case, the layer with the first metal and the resin is a resin layer added with the first metal powder, for example, that is, a thermal conductive resin layer that is mixed with the first metal. The resin layer is also called adhesive agent. The thermal conductive resin layer is also called thermal conductive adhesive agent. If the layer 5 with the first metal is a layer with the first metal and the resin or if the layer 5 with the first metal is formed by using a paste (for example, an Ag paste) that includes the first metal and a flux, a printing method such as a dispense method, a screen printing method, or the like may be used. According to the above-described embodiment, to form the resin layer added with the Ag powder as the layer 5 with the first metal, for example, an epoxy-based resin material that includes approximately 50 vol % of Ag powder with the average grain diameter of approximately 5 µm is formed to have the thickness of approximately 50 µm. As with the above-described first embodiment, when the semiconductor chip 1 is mounted on the stage 2 of the lead frame, the positions shift such as movement or rotation of the semiconductor chip 1 may be prevented. The heat resistance in the operation of the semiconductor chip 1 in the semiconductor device formed in the above-described manner is equal to or lower than approximately 0.5 degrees C/W. The heat resistance is equivalent to the heat resistance in the operation of the semiconductor device manufactured by bonding with the thermal conductive agent. Even if the semiconductor chip 1 is bonded with the stage 2 of the lead frame in the above-described manner, the heat of the semiconductor chip 1 may be efficiently radiated to the outside through the layer 5 with Ag and the resin, the layer 9 with the Sn—Ag alloy and the resin, and the stage 2 of the lead frame.

The layer 6 with the second metal may include a metal that is reactive with one of the first metals Ag, Cu, Au, Bi, In, Ni, Pi, and Sb as the second metal, that is, the metal that is melted and alloyed. For example, the layer 6 with the second metal may include one of Sn, Bi, In, Zn, Ag, Sb, Cu, Ni, and Pi as the second metal. That is, the layer 6 with the second metal may be the Sn layer with Sn. The layer 6 with the second metal may include Sn as a main component and at least one of Bi, In, Zn, Ag, Sb, Cu, Ni, and Pb. The layer 6 with the second metal may include one of Bi, In, Zn, Ag, Sb, Cu, Ni, and Pi. The layer 6 with the second metal may be a second metal layer with the second metal. The layer 6 with the second metal may include the second metal and another metal. The layer 6 with the second metal may include the second metal and a resin. In this case, the layer with the second metal and the resin is, for example, a resin layer added with second metal powder, that is, a thermal conductive resin layer that is mixed with the second metal. If the layer 6 with the second metal includes the second metal and the resin or if the layer with the second metal is formed by using a paste (for example, Sn paste) that includes the second metal and a flux, a dispense method, a printing method such as a dispense method, a screen printing method, or the like may be used. For example, according to the above-described embodiment, to form the layer 6 with the second metal by using the Sn paste, the Sn paste is formed by the screen printing method, for example. After that, the Sn paste is subjected to reflow processing to be formed under the condition that the melting point of Sn is approximately equal to or higher than 232 degrees C. or 250 degrees C. at the highest and the duration time is approximately 30 seconds or longer. In this case, as with the above-described embodiments, the position shift such as movement or rotation of the semiconductor chip 1 may be prevented when the semiconductor chip 1 is mounted on the stage 2 of the lead frame. The thermal resistance in the operation of the semiconductor chip 1 in the semiconductor device formed in the above-described manner is equal to or lower than approximately 0.3 degrees C/W. The thermal resistance is almost equal to the thermal resistance of the semiconductor device manufactured by solder bonding. Even if the semiconductor chip 1 is bonded with the stage 2 of the lead frame in the above-described manner, the heat of the semiconductor chip 1 may be radiated to the outside through the Ag layer 5, the Sn—Ag alloy layer 9, and the stage 2 of the lead frame.

The layer 9 that includes the alloy with the first metal and the second metal is a layer with one of the first metals Ag, Cu, Au, Bi, In, Ni, Pb, and Sb and the second metal that is reactive with the first metal and forms an alloy. For example, the layer that includes the alloy with the first metal and the second metal is a layer that includes one of the first metals Ag, Cu, Au, Bi, In, Ni, Pb, and Sb and one of the second metals Sn, Bi, In, Zn, Ag, Sb, Cu, Ni, and Pb. The layer that includes the alloy with the first metal and the second metal may be an alloy layer with the first metal and the second metal. The layer that includes the alloy with the first metal and the second metal may be an alloy layer with the first metal, the second metal, and another metal. The layer that includes an alloy with the first metal and the second metal may be a layer with an alloy with the first metal and the second metal, the first metal, and the second metal. The layer that includes an alloy with the first metal and the second metal may be a layer with a resin and an alloy with the first metal and the second metal. In this case, the layer that includes the alloy with the first metal and the second metal and the resin is, for example, a thermal conductive resin layer that is mixed with the alloy that includes the first metal and the second metal.

According to the above-described first embodiment, the Cr layer 8 as the layer with the third metal may be formed. The layer with the third metal is not limited to this case. The layer 8 with the third metal includes a metal that is non-reactive with the second metal, that is, a metal that does not form a solid solution with the second metal. For example, the layer 8 with the third metal includes one of Cr, Fe, Ti, and Zr.

According to the above-described embodiment, the layer 5 with the first metal is formed on the whole surface of the semiconductor chip mounting area 2A on the stage 2 of the lead frame, and the layer 6 with the second metal is formed in a part (a part of the central part) of the back surface of the semiconductor chip 1. However, the layer 5 and the layer 6 are not limited to the above-described case. That is, one of the layer 5 with the first metal and the layer 6 with the second metal is formed on one of the semiconductor chip mounting area 2A on the stage 2 of the lead frame and the back surface of the semiconductor chip 1. The other one of the layer 5 with the first metal and the layer 6 with the second metal may be formed in the area corresponding to a part of the area in which one of the layer 5 with the first metal and the layer 6 with the second metal of the other one of the semiconductor chip mounting area 2A and the back surface of the semiconductor chip 1.

For example, the layer 5 with the first metal may be formed in a part (a part of the central part) of the semiconductor chip mounting area 2A on the stage 2 of the lead frame, and the layer 6 with the second metal may be formed on the whole surface of the back surface of the semiconductor chip 1. The layer 5 with the first metal formed in the part (the part of the central part) of the semiconductor chip mounting area 2A on the stage 2 of the lead frame and the layer 6 with the second metal formed in the area opposite to the part are melted. The layer 6 with the second metal formed in the area (the area outside the central part) other than the area is not melted and remains solid. This prevents the position shift such as due movement or rotation of the semiconductor chip 1. The layer 5 with the first metal is formed in the central part of the semiconductor chip mounting area 2A on the stage 2 of the lead frame. Due to this, the layer 9 that includes the first metal and the second metal is prevented from oozing around the semiconductor chip mounting area 2A.

As illustrated in FIG. 6A, the layer 5 (the Ag layer in this case) with the first metal may be formed on the whole surface of the semiconductor chip mounting area 2A on the stage 2 of the lead frame. As illustrated in FIG. 6B, the layer 6 (the Sn layer in this case) with the second metal may be formed in a part (a plurality of parts) of the back surface of the semiconductor chip 1. For example, it is preferable that the layer 6 (the Sn layer in this case) with the second metal is formed in two positions on the diagonal line of the back surface of the semiconductor chip 1. The Sn layer 6 may be formed, for example, by the electrolytic plating method or the screen printing method. As illustrated in FIG. 6C, the semiconductor chip 1 is positioned on the semiconductor chip mounting area 5A of the stage 2. As illustrated in FIG. 6D, the Sn—Ag alloy layer 9 is formed, and the semiconductor chip 1 is bonded with the semiconductor chip mounting area 2A on the stage 2. Accordingly, the layer 6 with the second metal formed in the part (the plurality of parts) of the back surface of the semiconductor chip 1 and the layer 5 with the first metal formed in the area opposite to the part, and the layer 5 with the first metal formed in the area other than the area (the area around the plurality of parts) is not melted and remains solid. This prevents the position shift such as movement or rotation of the semiconductor chip 1. Since the layer 6 with the second metal is formed in a plurality of positions of the back surface of the semiconductor chip 1, the semiconductor chip 1 is prevented from rotating in the case of the heat bonding. The layer 6 with the second metal is formed in the plurality of parts of the area (the area other than the circumference) that is not in contact with the outer edge of the semiconductor chip mounting area 2A on the stage 2 of the lead frame. This prevents the layer 9, which includes the alloy with the first metal and the second metal around the semiconductor chip mounting area 2A, from oozing out in the heat bonding. In this case, the Cr layer 8 is formed in the area around the semiconductor chip mounting area 2A on the stage 2 of the lead frame. This surely prevents the Sn—Ag alloy layer 9 from oozing out. The heat resistance value in the operation of the semiconductor chip 1 in the semiconductor device formed in the above-described manner is equal to or lower than approximately 0.3 degrees C/W. The heat resistance value is equivalent to the heat resistance value of the semiconductor device manufactured by the solder bonding. Even if the semiconductor chip 1 is bonded with the stage 2 of the lead frame, the heat of the semiconductor chip 1 may be radiated to the outside through the Ag layer 5, the Sn—Ag alloy layer 9, and the stage 2 of the lead frame. In FIGS. 6A to 6D illustrate an example of a case of forming the Cr layer 8 in the area around the semiconductor chip mounting area 2A on the stage 2 of the lead frame. However, the first embodiment is not limited to this case. For example, the Cr layer 8 is not typically formed.

On the contrary, the layer 5 with the first metal is formed in a part (a plurality of parts) of the semiconductor chip mounting area 2A on the stage 2 of the lead frame, and the layer 6 with the second metal may be formed on the whole surface of the back surface of the semiconductor chip 1. In this case, the operation and effect equivalent to the above-described case are obtained. As illustrated in FIG. 7A, for example, the layer 5 with the first metal (the Ag layer in this case) may be formed on the whole surface of the semiconductor chip mounting area 2A on the stage 2 of the lead frame. As illustrated in FIG. 7B, the layer 6 with the second metal (the Sn layer in this case) may be formed in a part (the circumference) of the back surface of the semiconductor chip 1. As illustrated in FIG. 7C, the semiconductor chip 1 is positioned on the semiconductor chip mounting area 2A on the stage 2. As illustrated in FIG. 7D, the Sn—Ag alloy layer 9 is formed, and the semiconductor chip 1 is bonded with the semiconductor chip mounting area 2A on the stage 2. Therefore, the layer 6 with the second metal formed in the part (the circumference) of the back surface of the semiconductor chip 1 and the layer 6 with the second metal formed in the area opposite to the part are melted. The layer 5 with the first metal formed in the area (the area inside the circumference) other than the areas is not melted and remains solid. This prevents the position shift such as movement or rotation of the semiconductor chip 1. In particularly, since the layer with the second metal is formed in the circumference of the semiconductor chip 1 in the above-described manner, the layer 9 that includes the alloy with the first metal and the second metal may ooze around the semiconductor chip mounting area 2A. It is preferable that the layer 8 (the Cr layer in this case) with the third metal that is non-reactive with at least one of the first metal and the second metal is formed in the area around the semiconductor chip mounting area 2A on the stage 2 of the lead frame. Due to this, Sn is prevented from oozing out in the melting operation, that is, the Sn—Ag alloy layer 9 is prevented from oozing out. The heat resistance in the operation of the semiconductor chip 1 in the semiconductor device formed in the above-described manner is equal to or lower than approximately 0.3 degrees C/W. The heat resistance is equal to the heat resistance of the semiconductor device manufactured by the solder bonding. Even if the semiconductor chip 1 is bonded with the stage 2 of the lead frame, the heat of the semiconductor chip 1 is efficiently radiated to the outside through the Ag layer 5, the Sn—Ag alloy layer 9, and the stage 2 of the lead frame. FIGS. 7A to 7D illustrate a case of forming the Cr layer 8 in the area around the semiconductor chip mounting area 2A on the stage 2 of the lead frame. However, the first embodiment is not limited to this case. The Cr layer 8 may not be formed.

On the contrary, the layer 5 with the first metal is formed in a part (the circumference part) of the semiconductor chip mounting area 2A on the stage 2 of the lead frame. In this case, the operation and effect equivalent to the above-described case are obtained. For example, the layer 6 with the second metal may be formed on the whole surface of the semiconductor chip mounting area 2A on the stage 2 of the lead frame, and the layer 5 with the first metal may be formed in a part of the back surface of the semiconductor chip 1. Therefore, the layer 5 with the first metal formed in the part of the back surface of the semiconductor chip 1 and the layer 6 with the second metal formed in the area corresponding to the part are melted. The layer 6 with the second metal formed in the area other than the above-described area is not melted and remains solid. This prevents the position shift such as movement or rotation of the semiconductor chip 1. In particularly, when the layer 5 with the first metal is formed on the circumference of the back surface of the semiconductor chip 1, the layer 9 that includes the alloy with the first metal and the second metal may ooze around the semiconductor chip mounting area 2A. Therefore, it is preferable that the layer 8 with the third metal, which is non-reactive with at least one of the first metal and the second metal, is formed in the area around the semiconductor chip mounting area 2A on the stage 2 of the lead frame. As a result, Sn is prevented from oozing in the melting operation.

On the contrary, the layer 6 with the second metal may be formed in a part of the semiconductor chip mounting area 2A on the stage 2 of the lead frame, and the layer 5 may be formed on the whole surface of the back surface of the semiconductor chip 1. In this case, the operation and effect equivalent to the above-described case are obtained. According to the above-described first embodiment, the layer (Ag layer) 5 with the first metal is formed on the whole surface of the semiconductor chip mounting area 2A on the stage 2 of the lead frame, and the layer (Sn layer) 6 with the second metal is formed in a part (a part of the central part) on the back surface of the semiconductor chip 1. Therefore, the manufactured semiconductor device includes the layer (Ag layer) 5 with the first metal provided between the stage 2 and the semiconductor chip 1 and the layer (Sn—Ag alloy layer; the layer with the alloy obtained by alloying the first metal) 9 that includes the alloy with the first metal and the second metal. However, the first embodiment is not limited to this case.

For example, if the layer 6 with the second metal is formed on the whole surface of the semiconductor chip mounting area 2A on the stage 2 of the lead frame and if the layer 5 with the first metal is formed on a part of the back surface of the semiconductor chip 1, the manufactured semiconductor device includes the layer 6 with the second metal provided between the stage 2 and the semiconductor chip 1 and includes the layer (the layer with the alloy obtained by alloying the second metal) 9 that includes the alloy with the first metal and the second metal. In this case, the layer 6 with the second metal is bonded with the stage 2 and is in contact with the semiconductor chip 1.

For example, if the layer 5 with the first metal is formed in a part of the semiconductor chip mounting area 2A on the stage 2 of the lead frame and if the layer 6 with the second metal is formed on the whole surface of the back surface of the semiconductor chip 1, the manufactured semiconductor device includes the layer 6 with the second metal provided between the stage 2 and the semiconductor chip 1 and includes the layer (the layer with the alloy obtained by alloying the second metal) 9 that includes the alloy with the first metal and the second metal. In this case, the layer 6 with the second metal is bonded with the semiconductor chip 1 and is in contact with the stage 2.

For example, if the layer 6 with the second metal is formed in a part of the semiconductor chip mounting area 2A on the stage 2 of the lead frame and if the layer 5 with the first metal is formed on the whole surface of the back surface of the semiconductor chip 1, the manufactured semiconductor device includes the layer 5 with the first metal provided between the stage 2 and the semiconductor chip 1 and includes the layer (the layer with the alloy obtained by alloying the first metal) 9 that includes the alloy with the first metal and the second metal. In this case, the layer 5 with the first metal is bonded with the semiconductor chip 1 and is in contact with the stage 2.

According to the above-described embodiment, since the layer (Ag layer) 5 with the first metal is formed on the whole surface of the semiconductor chip mounting area 2A on the stage 2 of the lead frame and the layer (Sn layer) 6 with the second metal is formed in a part (a part of the central part) of the semiconductor chip 1, the manufactured semiconductor device includes the layer (Sn—Ag alloy layer; the layer with the alloy obtained by alloying the first metal) 9, which includes the alloy with the first metal and the second metal, in the central part of the semiconductor chip mounting area 2A on the stage 2 and includes the layer (Ag layer) 5 with the first metal outside the central part of the semiconductor chip mounting area on the stage 2. The first embodiment is not limited to this case.

For example, if the layer 5 with the first metal is formed in a part (a part of the central part) of the semiconductor chip mounting area 2A on the stage 2 of the lead frame and if the layer 6 with the second metal is formed on the whole surface of the back surface of the semiconductor chip 1, the manufactured semiconductor device includes the layer (the layer with the alloy obtained alloying the second metal) 9, which includes the alloy with the first metal and the second metal in the central part of the semiconductor chip mounting area 2A on the stage 2 and includes the layer 6 with the second metal outside the central part of the semiconductor chip mounting area 2A on the stage 2.

For example, if the layer 5 with the first metal is formed on the whole surface of the semiconductor chip mounting area 2A on the stage 2 of the lead frame and if the layer 6 with the second metal is formed in a part (a plurality of parts) of the back surface of the semiconductor chip 1, the manufactured semiconductor device includes the layer 9 having the alloy with the first metal and the second metal in the plurality of parts of the semiconductor chip mounting area 2A on the stage 2 and includes the layer 5 with the first metal around the layer 9 with the alloy provided in the plurality of parts of the semiconductor chip mounting area 2A on the stage 2. On the contrary, if the layer 5 with the first metal is formed in a part (a plurality of parts) of the semiconductor chip mounting area 2A on the stage 2 of the lead frame and if the layer 6 with the second metal is formed on the whole surface of the back surface of the semiconductor chip 1, the manufactured semiconductor device includes the layer (the layer with the alloy obtained by alloying the second metal) 9 that includes the alloy with the first metal and the second metal in the plurality of parts of the semiconductor chip mounting area 2A on the stage 2 and includes the layer 6 with the second metal around the layer with the alloy provided in the plurality of parts of the semiconductor chip mounting area 2A on the stage 2.

For example, if the layer 5 with the first metal is formed on the whole surface of the semiconductor chip mounting area 2A on the stage 2 of the lead frame and if the layer 6 with the second metal is formed in a part (circumference part) of the back surface of the semiconductor chip 1, the manufactured semiconductor device includes the layer 9 (the layer with the alloy obtained alloying the first metal) with the first metal and the second metal in the circumference of the semiconductor chip mounting area 2A on the stage 2 and includes the layer 5 with the first metal inside the circumference part of the semiconductor chip mounting area 2A on the stage 2. On the contrary, if the layer 5 with the first metal is formed in a part (a circumference) of the semiconductor chip mounting area 2A on the stage 2 of the lead frame and if the layer 6 with the second metal is formed on the whole surface of the back surface of the semiconductor chip 1, the manufactured semiconductor device includes the layer (the layer with the alloy obtained by alloying the second metal) 9 that includes the alloy with the first metal and the second metal in the circumference of the semiconductor chip mounting area 2A on the stage 2 and includes the layer 6 with the second metal inside the circumference of the semiconductor chip mounting area 2A on the stage 2.

For example, if the layer 8 with the third metal that is non-reactive with at least one of the first metal and the second metal is formed in the area around the semiconductor chip mounting area 2A on the stage 2 of the lead frame, the manufactured semiconductor device includes the layer 8 with the third metal that is non-reactive with at least one of the first metal and the second metal included in the layer 9 with the alloy, that is, the layer 8 with the other metal that is non-reactive with the metal included in the layer 9 with the alloy.

According to the deformation examples of the embodiment (see FIGS. 7A to 7D), for example, as illustrated in FIGS. 8A to 8D, before the semiconductor chip 1 is bonded with the semiconductor chip mounting area 2A, a projection part 10 may be formed on the surface of the layer 5 with the first metal. For example, there are three methods for forming the projection part 10. The first one is a method for forming the projection part 10 by changing the current density and applying Ag in an island-shape form when the Ag layer 5 is formed by the electrolytic plating method, for example. For example, when the Ag layer 5 with the thickness of approximately 5μ is formed by the electrolytic plating method, the Ag layer 5 with the surface roughness of ±3 μm is formed by changing the current density. The second one is a method for forming the projection part 10 on the surface of the Ag layer 5 by performing sandblasting processing with alumina, garnet, and glass beads with the grain size of #100 to #200 on the Ag layer 5 to make the surface of the Ag layer 5 rough. The third one is a method for forming the projection part 10 on the surface of the Ag layer 5 by spraying the Ag powder with the average grain diameter of approximately 10 μm to 20 μm or the Ag paste to fix the Ag powder or the Ag paste to the Ag layer 5. In this case, regarding the manufactured semiconductor device, the projection part 10 is formed on the surface of the Ag layer 5. In this manner, before the semiconductor chip 1 is bonded with the semiconductor chip mounting area 2A, the projection part 10 may be formed on the surface of one of the layer 6 with the second metal and the layer 5 with the first metal formed on the whole surface of one of the semiconductor chip mounting area 2A and the back surface of the semiconductor chip 1. In this case, regarding the manufactured semiconductor device, the projection unit 10 is formed on the surface of the layer with the metal (the Ag layer in this case). Accordingly, when the semiconductor chip 1 is bonded with the semiconductor chip mounting area 2A on the stage 2 of the lead frame, the projection part 10 is plastically deformed. Thus, the contact area of the semiconductor chip mounting area 2A on the stage 2 and the surface of the semiconductor chip 1 is increased, so that reduction in thermal resistance may be achieved. The thermal resistance in the operation of the semiconductor chip 1 in the semiconductor device formed in the above-described manner is equal to or lower than approximately 0.1 degrees C/W. The thermal resistance is smaller than the thermal resistance of the semiconductor device manufactured by the solder bonding. Even if the semiconductor chip 1 is bonded with the stage 2 of the lead frame in the above-described manner, the heat of the semiconductor chip 1 may be efficiently radiated to the outside through the Ag layer 5, the Sn—Ag alloy layer 9, the projection part 10, and the stage 2. FIGS. 8A to 8D illustrate a case of forming the Cr layer 8 in the area around the semiconductor chip mounting area 2A on the stage 2 of the lead frame. However, the first embodiment is not limited to this case. The Cr layer 8 may not be formed. FIGS. 8A to 8D illustrate a case that is applied to the deformation example of the above-described embodiment. The first embodiment is not limited to this case. The case is applicable to the above-described embodiment (see FIGS. 1A to 1D) and the other embodiment (see FIGS. 5A to 5C and FIGS. 6A to 6D).

Figure 9:
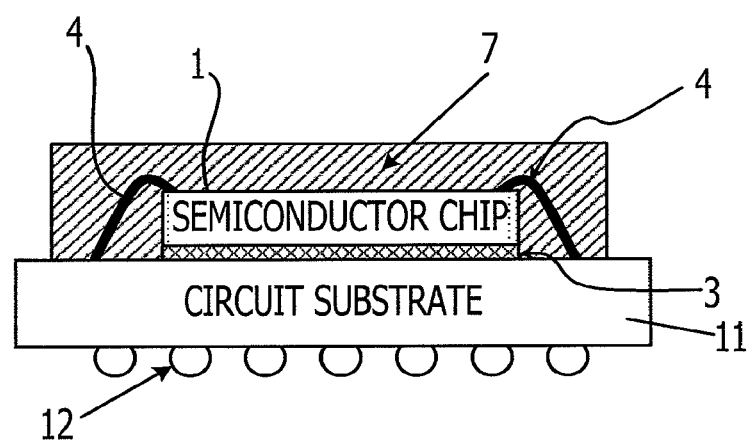
FIG. 9 is a cross-sectional diagram illustrating an example of a semiconductor according to the deformation of the first embodiment.

According to the above-described first embodiment, the discrete package is given as an example. However, the first embodiment is not limited to the discrete package. Another semiconductor package is applicable. According to the above-described first embodiment, since the semiconductor device is manufactured by using the lead frame, the manufactured semiconductor device includes the semiconductor chip 1 on the stage 2 of the lead frame. However, the first embodiment is not limited to this case. As illustrated in FIG. 9, for example, the semiconductor chip 1 is provided on a circuit substrate 11 such as a package substrate with a Ball Grid Array (BGA) ball 12, and the semiconductor chip 1 is coupled with the circuit substrate 11 with the bonding wire 4 (for example, an Au wire). In the semiconductor device (semiconductor package) encapsulated with the molding compound 7, the present invention is applicable to the bonding layer 3 that is used to bond the semiconductor chip 1 with the circuit substrate 11. The present invention is applicable to the semiconductor device that includes the semiconductor chip on the circuit substrate such as a print substrate (a wiring substrate) or the like. The circuit substrate such as a package substrate or a print substrate is called support plate.

Figure 10:
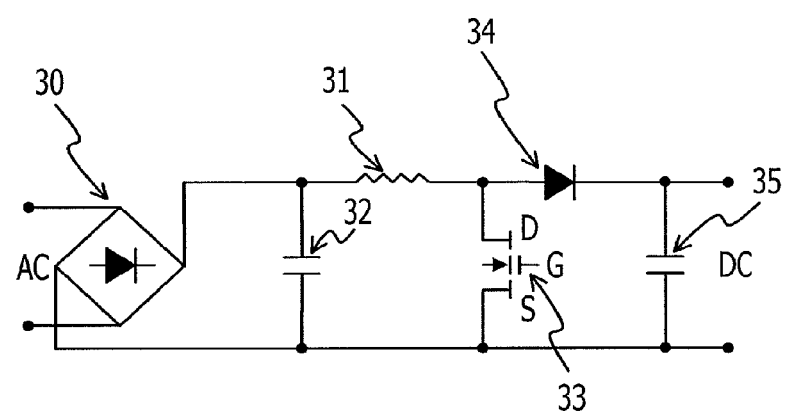
FIG. 10 is a diagram illustrating an example of a PFC circuit included in a power source device according to a second embodiment.

With reference to FIG. 10, a power source device according to a second embodiment will be described.

The power source device according to the second embodiment includes a semiconductor package with the above-described GaN-HRMT. For example, the GaN-HEMT included in the above-described semiconductor package is used in a power factor correction (PFC) circuit included in the power source device for a server.

As illustrated in FIG. 10, the PFC circuit includes a diode bridge 30, a choke coil 31, a first condenser 32, a GaN-HEMT 33 included in the above-described semiconductor package, a diode 34, and a second condenser 35. In this case, the PFC circuit has a configuration in which the diode bridge 30, the choke coil 31, the first condenser 32, the GaN-HEMT 33 included in the above-described semiconductor package, the diode 34, and the second condenser 35 are mounted on the circuit substrate.

According to the second embodiment, the drain lead 23 of the above-described semiconductor package, the source lead 22, and the gate lead 21 are inserted into a drain lead inserting unit, a source lead inserting unit, and a gate lead inserting unit of the circuit substrate, respectively, and are then fixed with a solder or the like, for example. In this manner, the GaN-HEMT 33 included in the above-described semiconductor package is coupled to the PFC circuit that is formed on the circuit substrate.

On the PFC circuit, one of the terminals of the choke coil 31 and an anode terminal of the diode 34 are coupled with the drain electrode D of the GaN-HEMT 33. The other terminal of the choke coil 31 is coupled with one of the terminals of the first condenser 32, and a cathode terminal of the diode 34 is coupled with one of the terminals of the second condenser. The other terminal of the first condenser 32, the source electrode S of the GaN-HEMT 33, and the other terminal of the second condenser 35 are grounded. Both the terminals of the first condenser 32 are coupled with a pair of terminals of the diode bridge 30. Another pair of terminals of the diode bridge 30 is coupled with the input terminal into which an alternating-current (AC) voltage is input. Both terminals of the second condenser 35 are coupled with the output terminal from which a direct-current (DC) voltage is output. The gate electrode G of the GaN-HEMT 33 is coupled with a gate driver (not illustrated). If the GaN-HEMT 33 is driven by the gate driver, the PFC circuit converts the AC voltage input from the input terminal into the DC voltage and then outputs the DC voltage from the output terminal.

Therefore, the power source device according to the second embodiment has an advantage for improving the reliability. That is, there is an advantage that a power source device with a high reliability may be configured since the semiconductor package according to the first embodiment has the high reliability. In this case, the above-described semiconductor device (the GaN-HEMT or the semiconductor package with the GaN-HEMT) has been described in a case of using for the PFC circuit included in the power source device used by the server. However, the second embodiment is not limited to this case. For example, the above-described semiconductor device (the GaN-HEMT or the semiconductor package with the GaN-HEMT) may be used in an electronic apparatus (electronic device) such as a computer other than a server. The above-described semiconductor device (the semiconductor package) may be used for another circuit (for example, a DC-DC converter) included in the power source device. The present invention is not limited to the configurations described in the above-described embodiments and deformation examples.

For example, in the description of the above-described embodiments and deformation examples, the semiconductor chip that includes the GaN-HEMT is given as an example. However, the semiconductor chip is not limited to this example.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments) of the present invention(s) has(have) been described in detail, it should be understood that the various changes, substitutions, and alterations could be made hereto without departing from the spirit and scope of the invention.

What is claimed is:

1. A semiconductor device comprising:
    a support plate;
    a semiconductor chip formed over the support plate;
    an alloy layer, formed between the support plate and the semiconductor chip, includes an alloy with a first metal and a second metal, wherein the semiconductor chip is bonded with the support plate by metal-bonding with the alloy layer; and
    a first metal layer, formed around the alloy layer and formed between the support plate and the semiconductor chip, includes the first metal, wherein the first metal layer is bonded with the support plate.

2. The semiconductor device according to claim 1,
    wherein the alloy layer is formed in a central part of a semiconductor chip mounting area of the support plate, and
    wherein the first metal layer is formed outside the central part of the semiconductor chip mounting area on the support plate.

3. The semiconductor device according to claim 1,
    wherein the alloy layer is formed in a plurality of parts of a semiconductor chip mounting area of the support plate, and
    wherein the first metal layer is formed on a circumference of the alloy layer formed in the plurality of parts of the semiconductor chip mounting area of the support plate.

4. The semiconductor device according to claim 1,
    wherein the alloy layer is formed on the circumference of a semiconductor chip mounting area of the support plate; and
    wherein the first metal layer is formed inside the circumference of the semiconductor chip mounting area of the support plate.

5. The semiconductor device according to claim 1, further comprising:
    a second metal layer formed on the circumference of a semiconductor chip mounting area and which includes a third metal that is non-reactive with the second metal included in the alloy layer.

6. The semiconductor device according to claim 1,
    wherein the first metal layer includes a projection part on the surface thereof.

7. The semiconductor device according to claim 1,
    wherein the first metal layer and the alloy layer further includes a resin.

8. The semiconductor device according to claim 1, further comprising:
    an adhesion layer formed between the semiconductor chip and the alloy layer.

* * * * *